(12) United States Patent
Pust et al.

(10) Patent No.: US 12,255,271 B2
(45) Date of Patent: Mar. 18, 2025

(54) OPTOELECTRONIC UNIT AND METHOD FOR IDENTIFYING AN OPTOELECTRONIC UNIT

(71) Applicant: ams-OSRAM International GmbH, Regensburg (DE)

(72) Inventors: Philipp Pust, Langquaid (DE); Stefan Lange, Augsburg (DE); Sebastian Stoll, Coburg (DE)

(73) Assignee: ams-OSRAM International GmbH, Regensburg (DE)

( * ) Notice: Subject to any disclaimer, the term of this patent is extended or adjusted under 35 U.S.C. 154(b) by 236 days.

(21) Appl. No.: 18/013,543

(22) PCT Filed: Sep. 8, 2021

(86) PCT No.: PCT/EP2021/074699
§ 371 (c)(1),
(2) Date: Dec. 28, 2022

(87) PCT Pub. No.: WO2022/053508
PCT Pub. Date: Mar. 17, 2022

(65) Prior Publication Data
US 2023/0290908 A1    Sep. 14, 2023

(30) Foreign Application Priority Data

Sep. 11, 2020 (DE) .................... 10 2020 123 707.3
Oct. 6, 2020 (DE) .................... 10 2020 126 112.8

(51) Int. Cl.
*G01N 21/64* (2006.01)
*H01L 33/50* (2010.01)

(52) U.S. Cl.
CPC .......... *H01L 33/502* (2013.01); *G01N 21/64* (2013.01); *H01L 33/504* (2013.01)

(58) Field of Classification Search
CPC ...... H01L 33/502; H01L 33/504; G01N 21/64
See application file for complete search history.

(56) References Cited

U.S. PATENT DOCUMENTS 6,610,563 B1 * 8/2003 Waitl ................ H01L 31/02325
438/161
7,838,357 B2 * 11/2010 Bogner .................. H01L 33/60
438/200

(Continued)

OTHER PUBLICATIONS

International Search Report issued for corresponding International Patent Application No. PCT/EP2021/074699 on Dec. 23, 2021, along with an English translation (6 pages).

(Continued)

*Primary Examiner* — Dani Fox
*Assistant Examiner* — Fani Polyzos Boosalis
(74) *Attorney, Agent, or Firm* — HAUPTMAN HAM, LLP (57) ABSTRACT

An optoelectronic unit includes a semiconductor chip configured to emit primary radiation with a first wavelength range during operation of the optoelectronic unit. The optoelectronic unit also includes a component including an optically active material. The component is arranged at least partially in the beam path of the semiconductor chip. The optically active material is not intended to be excited by the primary radiation with the first wavelength range. The optically active material incudes a proportion in the component of 0.004 wt %, inclusive, to 1 wt %, inclusive.

20 Claims, 10 Drawing Sheets

(56) References Cited

U.S. PATENT DOCUMENTS

| | | |
|---|---|---|
| 2011/0102706 A1 | 5/2011 | Oshio |
| 2014/0117393 A1 | 5/2014 | van Heerbeek et al. |
| 2017/0200869 A1 | 7/2017 | Lange et al. |
| 2017/0222100 A1 | 8/2017 | David et al. |
| 2021/0328114 A1* | 10/2021 | Tangring ................ C09K 11/02 |

OTHER PUBLICATIONS

Written Opinion issued for corresponding International Patent Application No. PCT/EP2021/074699 on Dec. 23, 2021 (7 pages).

* cited by examiner

OPTOELECTRONIC UNIT AND METHOD FOR IDENTIFYING AN OPTOELECTRONIC UNIT

CROSS REFERENCE TO RELATED APPLICATION

This application is a National Stage of International Application No. PCT/EP2021/074699, filed on Sep. 8, 2021, which designates the United States and was published in Europe, and which claims priority to German Patent Application Nos. 1) 10 2020 123 707.3, filed on Sep. 11, 2020; and 2) 10 2020 126 112.8, filed on Oct. 6, 2020, in the German Patent Office. All of the aforementioned applications are hereby incorporated by reference in their entireties.

An optoelectronic unit is specified. In addition, a method for identifying an optoelectronic unit is specified.

One object to be solved is to provide an optoelectronic unit that is particularly easy to identify. A further object to be solved is to provide a method for identifying an optoelectronic unit, with which an identifiable optoelectronic unit can be identified.

An optoelectronic unit is specified. The optoelectronic unit is, for example, a radiation-emitting optoelectronic unit.

According to at least one embodiment, the optoelectronic unit comprises a semiconductor chip configured to emit a primary radiation with a first wavelength range during operation of the optoelectronic unit. The semiconductor chip can comprise an active layer sequence that includes an active region that can generate the primary radiation during operation of the optoelectronic unit. Primary radiation herein and hereinafter refers to electromagnetic radiation of a first wavelength or a first wavelength range that is emitted by the semiconductor chip. The semiconductor chip is, for example, a light emitting diode chip or a laser diode chip.

According to at least one embodiment, the optoelectronic unit comprises a component comprising an optically active material. In particular, the component comprises an optically active material and a matrix material. In particular, the optically active material is surrounded by the matrix material. In particular, the optically active material can be configured to absorb electromagnetic radiation, convert the wavelength or the wavelength range of the electromagnetic radiation, and emit electromagnetic radiation of the converted wavelength or wavelength range. For example, the optically active material comprises or consists of a phosphor. In particular, the optically active material comprises a specific optical signature. For example, a specific optical signature is a specific emission spectrum.

According to at least one embodiment, the component is arranged at least partially in the beam path of the semiconductor chip. In other words, at least a part of the primary radiation emitted by the semiconductor chip impinges on a part of the component. In this case, the component can be arranged immediately subsequent to the radiation exit surface of the semiconductor chip, so that the radiation from the semiconductor chip impinges directly on the component. In this case, the component can be arranged in direct contact with the semiconductor chip. Alternatively, the component and the semiconductor chip can be spaced apart from each other. In this case, the radiation from the semiconductor chip can be deflected via optical elements, for example, before it impinges on the component.

According to at least one embodiment, the optically active material is not intended to be excited by the primary radiation with the first wavelength range. In other words, the first wavelength range comprises no or substantially no overlap with the absorption bands of the optical material. Thus, the optical material cannot absorb or can substantially not absorb the primary radiation of the semiconductor chip, is accordingly not excited, and comprises no emission of electromagnetic radiation after excitation with wavelengths of the first wavelength range. In particular, the optically active material is characterized in that it comprises a wavelength-dependent remission or diffuse reflectivity $R(\lambda)$ of greater than or equal to 80%, preferably of greater than or equal to 90%, particularly preferably of greater than or equal to 95% in the first wavelength range.

Alternatively or additionally, the optically active material comprises a low value for the Kubelka-Munk function for wavelengths in the first wavelength range. The Kubelka-Munk function is a way to describe the relative absorption strengths of optically active materials and phosphors at different wavelengths. The Kubelka-Munk function can be derived from the results of the diffuse reflectivity or remission measurement. The result data of the diffuse reflectivity measurement are transformed into the Kubelka-Munk function $KMF(\lambda)$ according to the following protocol:

$$KMF(\lambda)=K(\lambda)/S(\lambda)=(1-R(\lambda))^2/(2R(\lambda)),$$

wherein $K(\lambda)$ describes the absorption of the phosphor at wavelength $\lambda$, $S(\lambda)$ describes the scattering properties of the phosphor at wavelength $\lambda$, and $R(\lambda)$ is the measured diffuse reflectivity or remission at wavelength $\lambda$. In this context, a low value for $KMF(\lambda)$ means low absorption and excitability of the optically active material.

According to at least one embodiment, the optoelectronic unit comprises a semiconductor chip configured to emit primary radiation with a first wavelength range during operation of the optoelectronic unit, a component comprising an optically active material, wherein the component is arranged at least partially in the beam path of the semiconductor chip, and the optically active material is not intended to be excited by the primary radiation with the first wavelength range.

Such an optoelectronic unit comprises a component with an optically active material which is not activated by the primary radiation of the semiconductor chip and thereby does not affect the optical properties, in particular the emission spectrum and the brightness, of the optoelectronic unit as well as the stability of the optoelectronic unit within the normal manufacturing tolerances. By employing the optically active material in the optoelectronic unit, the optical signature of the optically active material can be detected by subsequent spectroscopic examinations, allowing the optoelectronic unit to be easily recognized or identified. In addition, such an optoelectronic unit can be easily and inexpensively produced.

According to at least one embodiment, the semiconductor chip emits primary radiation in the visible wavelength range. The first wavelength range thus comprises wavelengths from the visible wavelength range. In other words, the semiconductor chip emits primary radiation in the wavelength range from 365 nm to 750 nm, in particular from 415 nm to 750 nm. For example, the semiconductor chip emits primary radiation in the blue wavelength range, in the green wavelength range, or in the red wavelength range. For example, the semiconductor chip emits blue primary radiation with a wavelength of 450 nm.

According to at least one embodiment, the component comprises at least one phosphor configured to at least partially convert the primary radiation of the semiconductor chip into secondary radiation. In particular, the phosphor converts the primary radiation of the semiconductor chip into secondary radiation with a wavelength range that differs at least partially, in particular completely, from the first wavelength range of the primary radiation of the semiconductor chip. For example, the phosphor converts blue primary radiation into green or red or yellow secondary radiation or into secondary radiation in the near-infrared range.

The component can comprise exactly one phosphor or two or more phosphors that convert the primary radiation of the semiconductor chip into secondary radiation. In particular, there can be a partial conversion or a full conversion. Thus, the radiation emitted by the optoelectronic unit can be composed of the primary radiation and the secondary radiation or exclusively of the secondary radiation. The color impression of the optoelectronic unit can be adjusted by mixing the primary radiation and/or secondary radiation accordingly.

According to at least one embodiment, the optoelectronic unit emits radiation in the visible wavelength range during operation. The radiation emitted by the optoelectronic unit during operation is, for example, composed of the primary radiation of the semiconductor chip and the secondary radiation of the at least one phosphor. For example, the optoelectronic unit emits blue primary radiation and/or red and/or green and or yellow secondary radiation. In particular, the optoelectronic unit emits white mixed light from blue primary radiation and red and/or yellow and/or green secondary radiation.

According to at least one embodiment, the component comprises or is an optical element, a casting, a conversion layer, or a passivation layer of the semiconductor chip.

A component formed as an optical element is, for example, a lens that can be used for focusing or defocusing radiation emitted from the optoelectronic unit.

A component formed as a casting surrounds the semiconductor chip at least partially, in particular completely. A casting serves to protect the semiconductor chip from external influences. In particular, the casting can be formed as a conversion casting. In other words, the casting can comprise one or more phosphors.

A component formed as a conversion layer comprises one or more phosphors. The conversion layer can be arranged directly on the semiconductor chip or with a distance to the semiconductor chip.

A component formed as a passivation layer of the semiconductor chip is arranged in particular directly on the semiconductor chip. A passivation layer serves to protect the semiconductor chip. For example, the passivation layer is free of phosphors.

According to at least one embodiment, the optoelectronic unit is free of a semiconductor chip or an optically active element configured to excite the optically active material. In particular, the optoelectronic unit is free of a semiconductor chip and an optically active element configured to excite the optically active material. An optically active element is, for example, an emitter or a phosphor that emits radiation, in particular secondary radiation, for example in the green or red wavelength range. In other words, the optoelectronic unit does not comprise a semiconductor chip or an optically active element that emits a wavelength that the optically active material can absorb during operation of the optoelectronic unit. Thus, during operation of the optoelectronic unit, no electromagnetic radiation is generated in the optoelectronic unit with wavelengths that can excite the optically active element. As a result, the optically active material is not activated during operation of the optoelectronic unit and advantageously does not affect the optical properties of the optoelectronic unit.

According to at least one embodiment, the optically active material substantially does not absorb radiation in the visible spectral range.

"Substantially" can mean here and hereinafter, in particular, that a presence of the optically active material is not perceptible to the human observer.

In other words, the optically active material comprises a wavelength-dependent remission or diffuse reflectivity R(Z) in the visible spectral range of greater than or equal to 80%, preferably of greater than or equal to 90%, particularly preferably of greater than or equal to 95%. Thus, the optically active material is advantageously suitable for not affecting the optical properties of an optoelectronic unit emitting radiation in the visible spectral range.

According to at least one embodiment, the optically active material is substantially transparent to radiation emitted from the optoelectronic unit during operation. In other words, the optically active material transmits all wavelengths emitted from the optoelectronic unit during operation of the optoelectronic unit and thus present in the optoelectronic unit. In particular, radiation emitted from the optoelectronic unit during operation is substantially not absorbed, reflected and/or scattered by the optically active material. Thus, the optically active material is advantageously suitable for not affecting the optical properties of an optoelectronic unit emitting radiation in the visible spectral range.

According to at least one embodiment, the optically active material does not substantially affect the optical properties of the optoelectronic unit. In particular, the optically active material cannot be activated by radiation emitted by the optoelectronic unit during operation, whereby the emission spectrum of the optoelectronic unit is not affected during operation. In particular, the emission spectrum of the optoelectronic unit during operation is neither deformed nor is the system efficiency reduced. In addition, the optically active material has substantially no effect on the scattering in the optoelectronic unit. In particular, little scattering is induced by introducing the optically active material into a component of the optoelectronic unit, thereby not affecting the color location and brightness of the optoelectronic unit.

According to at least one embodiment, the optically active material is configured to absorb radiation of a second wavelength range and convert it into secondary radiation. In particular, the optically active material converts the radiation of the second wavelength range into secondary radiation with a wavelength range that is at least partially, in particular completely, different from the second wavelength range. In particular, the optically active material comprises a wavelength-dependent remission or diffuse reflectivity $R(\lambda)$ of less than or equal to 70%, preferably of less than or equal to 50%, particularly preferably of less than or equal to 30% in the second wavelength range. Alternatively or additionally, the optically active material comprises a high value for the Kubelka-Munk function for wavelengths of the second wavelength range. In this context, a high value for $KMF(\lambda)$ means a high absorption and excitability of the optically active material.

According to at least one embodiment, the ratio of the Kubelka-Munk function in the second wavelength range to the Kubelka-Munk function in the first wavelength range of the optically active material is greater than or equal to 10, in particular greater than or equal to 100, preferably greater than or equal to 1000. Such a ratio of Kubelka-Munk functions means that the Kubelka-Munk function for the optically active material in the second wavelength range is much greater than the Kubelka-Munk function in the first wavelength range. In other words, the optically active material absorbs much more in second wavelength range than in the first wavelength range.

According to at least one embodiment, the second wavelength range is at least partially, in particular completely, different from the first wavelength range of the primary radiation of the semiconductor chip. According to at least one further embodiment, the second wavelength range is at least partially, in particular completely, different from the radiation emitted by the optoelectronic unit during operation. The optically active material is thus configured to convert wavelengths that are not emitted by the optoelectronic unit during operation.

According to at least one embodiment, the second wavelength range comprises shorter wavelengths than the first wavelength range and the optically active material converts the radiation of the second wavelength range into radiation with longer wavelengths. In other words, a down conversion of the radiation of the second wavelength range takes place. For example, the optically active material converts radiation in the blue or ultraviolet wavelength range into radiation in the visible and/or near-infrared wavelength range, in particular into radiation in the green, yellow and/or red wavelength range.

According to at least one embodiment, the optically active material converts radiation with a wavelength shorter than 415 nm into radiation in the visible wavelength range.

According to at least one embodiment, the optically active material converts radiation with a wavelength shorter than 365 nm, in particular shorter than 300 nm, into radiation in the visible wavelength range.

An optically active material that converts radiation of the second wavelength range into radiation with longer wavelengths is preferably only excited by UV radiation and shows emission in the visible range. However, in the case of radiation emitted during operation of the optoelectronic unit, in particular radiation in the visible wavelength range, such an optically active material is not excited and thus does not influence the optical properties of the optoelectronic unit.

According to at least one embodiment, the second wavelength range comprises longer wavelengths than the first wavelength range and the optically active material converts the radiation of the second wavelength range into radiation with shorter wavelengths. In other words, an up conversion of the radiation of the second wavelength range takes place. In particular, the optically active material converts infrared radiation into radiation in the visible wavelength range. For example, the optically active material converts radiation with a wavelength longer than 750 nm into radiation in the visible wavelength range. Such an optically active material is only excited by infrared radiation and exhibits emission visible range. However, in the case of radiation emitted during operation of the optoelectronic unit, in particular radiation in the visible wavelength range, such an optically active material is not excited and thus does not influence the optical properties of the optoelectronic unit.

According to at least one embodiment, the optically active material comprises a recognizable emission spectrum. The emission spectrum of the optically active material comprises at least one, in particular at least two, characteristic emission bands that have a high recognition value using spectroscopic methods. In particular, the optically active material comprises a line spectrum. Line spectra comprise a plurality of characteristic, in particular narrow, emission bands. Line emitters are therefore particularly advantageous as optically active materials.

According to at least one embodiment, the optically active material comprises a content in the component of 0.004 weight percent (wt %) inclusive to 1 wt % inclusive, in particular greater than or equal to 0.05 wt % and less than or equal to 1 wt %, for example 0.05 wt %, 0.25 wt % or 1 wt %. Due to the low concentration of the optically active material in the component, the optically active material has substantially no effect on the scattering in the optoelectronic unit and does not affect the color location and brightness of the optoelectronic unit.

According to at least one embodiment, the optically active material is selected from a group consisting of $CeMgAl_{11}O_{19}$:Tb, $BaMgAl_{10}O_{17}$:Eu, $LaPO_4$:Tm, $YBO_3$:Tm, $LaPO_4$:Ce, Tb, $LaMgB_5O_{10}$Ce, Tb, $LaMgAl_{11}O_{19}$:Ce, Tb, $Y_2O_3$:Eu, (Y, Gd) $BO_3$:Eu, $YVO_4$:Eu, and combinations thereof. These materials comprise good miscibility with standard phosphors and matrix materials and are therefore particularly compatible with established methods and processes for producing optoelectronic units. In addition, these materials are stable and inexpensive.

According to at least one embodiment, the optically active material comprises $CeMgAl_{11}O_{19}$:Tb, $BaMgAl_{10}O_{17}$:Eu and/or $Y_2O_3$:Eu or consists of $CeMgAl_{11}O_{19}$:Tb, $BaMgAl_{10}O_{17}$:Eu and/or $Y_2O_3$:Eu. The optically active materials $CeMgAl_{11}O_{19}$:Tb, $BaMgAl_{10}O_{17}$:Eu and $Y_2O_3$:Eu comprise a wavelength-dependent remission or diffuse reflectivity $R(\lambda)$ of significantly over 95% in the entire wavelength range from 450 nm to 700 nm. $BaMgAl_{10}O_{17}$:Eu shows a remission of below 70% for wavelengths below 410 nm, $CeMgAl_{11}O_{19}$:Tb for wavelengths below 320 nm and $Y_2O_3$:Eu for wavelengths below 270 nm. Thus, these optically active materials are particularly advantageously configured not to influence the optical properties of the optoelectronic unit during operation and at the same time to exhibit good excitability for wavelengths in the UV range.

Further, a method for identifying an optoelectronic unit is specified. Preferably, the optoelectronic unit according to the embodiments mentioned above is identified with the method described herein. In particular, all explanations made for the optoelectronic unit also apply to the method and vice versa.

According to at least one embodiment, the method for identifying an optoelectronic unit comprises providing an optoelectronic unit. The features of the optoelectronic unit have already been described in connection with the optoelectronic unit and also apply to the optoelectronic unit in the method for identifying an optoelectronic unit.

According to at least one embodiment, the method comprises irradiating the optoelectronic unit with electromagnetic radiation of a second wavelength range from outside the optoelectronic unit. Irradiating the optoelectronic unit from outside is performed in particular via an external radiation source arranged outside the optoelectronic unit. In particular, the external radiation source is not a part, component or element of the optoelectronic unit. The external radiation source is arranged in relation to the optoelectronic unit such that the radiation from the external radiation source impinges at least on the component of the optoelectronic unit. In other words, at least the component of the optoelectronic unit is arranged in the beam path of the external radiation source. For example, the external radiation source is a UV lamp or an IR lamp.

According to at least one embodiment, the method comprises detecting the secondary radiation emitted by the optoelectronic unit. The secondary radiation emitted by the optoelectronic unit comprises or consists of the secondary radiation generated by conversion of the radiation of the second wavelength range by the optically active material in the optoelectronic unit. Optionally, the secondary radiation emitted by the optoelectronic unit can also comprise secondary radiation generated by a phosphor. Additionally, if the method for identifying an optoelectronic unit is performed during operation of the optoelectronic unit, it is additionally possible that the secondary radiation emitted by the optoelectronic unit also comprises primary radiation from the semiconductor chip.

The detection of the emitted secondary radiation is performed in particular via an external detection element arranged outside the optoelectronic unit. In particular, the external detection element or the detector is arranged in such a way that the emitted secondary radiation can impinge on or be directed onto the detector.

According to at least one embodiment, the method for identifying an optoelectronic unit comprises providing an optoelectronic unit, irradiating the optoelectronic unit with electromagnetic radiation of a second wavelength range from outside the optoelectronic unit, and detecting the secondary radiation emitted by the optoelectronic unit.

Such a method is particularly suitable for spectroscopic detection of optoelectronic units via the optical signature of an optically active material in a component of the optoelectronic unit. In particular, this method is particularly easy to perform.

According to at least one embodiment, the second wavelength range comprises shorter wavelengths than the first wavelength range. In particular, the external radiation source emits radiation in the blue or ultraviolet wavelength range. For example, the second wavelength range includes wavelengths shorter than 415 nm or wavelengths shorter than 365 nm, particularly shorter than 300 nm. In particular, the optically active material converts the radiation with short wavelengths of the second wavelength range into radiation with longer wavelengths, in particular radiation in the visible and/or near-infrared wavelength range. Thus, the optoelectronic unit can be identified by irradiation with, for example, UV radiation.

According to at least one embodiment, the second wavelength range comprises longer wavelengths than the first wavelength range. In particular, the external radiation source emits radiation in the infrared wavelength range. For example, the second wavelength range includes wavelengths longer than 750 nm. In particular, the optically active material converts the radiation with long wavelengths of the second wavelength range into radiation with shorter wavelengths, in particular radiation in the visible wavelength range. Thus, the optoelectronic unit can be identified by irradiation with, for example, IR radiation.

According to at least one embodiment, the optoelectronic unit can be identified by means of the secondary radiation. The secondary radiation comprises the optical signature of the optically active material. Based on this optical signature, the optoelectronic unit can be allocated. In particular, the optical signature comprises characteristic emission bands of the optically active material that are generated exclusively by excitation with radiation of the second wavelength range. For example, the characteristic emission bands of the optically active material are lines of a line spectrum.

It is possible that the secondary radiation includes further emission bands, for example from a phosphor of the optoelectronic unit that is also excited. This can lead to superpositions of these emission bands with the characteristic emission bands of the optically active material, wherein the characteristic emission bands of the optically active material can be clearly assigned in the superposition spectrum.

If the method for identifying an optoelectronic unit is carried out during operation of the optoelectronic unit, the secondary radiation emitted by the optoelectronic unit includes not only the characteristic emission bands of the optically active material but also the secondary radiation emitted during operation of the optoelectronic unit, which is composed, for example, of the primary radiation of the semiconductor chip and secondary radiation from conversion. In this case, too, the characteristic emission bands of the optically active material can be clearly assigned in the superposition spectrum.

According to at least one embodiment, the method for identifying an optoelectronic unit is not performed during operation of the optoelectronic unit. In other words, the optoelectronic unit is switched off during the identification. In an optoelectronic unit that is switched off, the total amount of emitted radiation is significantly lower. Thus, a better signal-to-noise ratio can be obtained and the identification efficiency can be improved.

According to at least one embodiment, the optically active material converts the radiation of the second wavelength range into radiation in the visible wavelength range, in particular in the green, yellow and/or red wavelength range. This makes detection of the secondary radiation particularly easy and inexpensive.

Further advantageous embodiments, configurations and further developments of the optoelectronic unit and of the method for identifying an optoelectronic unit result from the following exemplary embodiments shown in conjunction with the figures.

Elements that are identical, similar or have the same effect are marked with the same reference signs in the figures. The figures and the proportions of the elements shown in the figures are not to be regarded as true to scale. Rather, individual elements, in particular layer thicknesses, can be shown exaggeratedly large for better representability and/or understanding.

Figure 1:
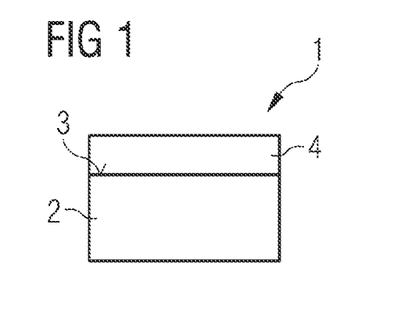
FIGS. 1-3 each show a schematic representation of an optoelectronic unit according to various exemplary embodiments.
Figure 2:
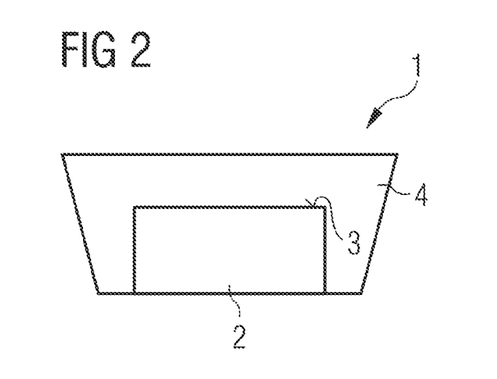
Figure 3:
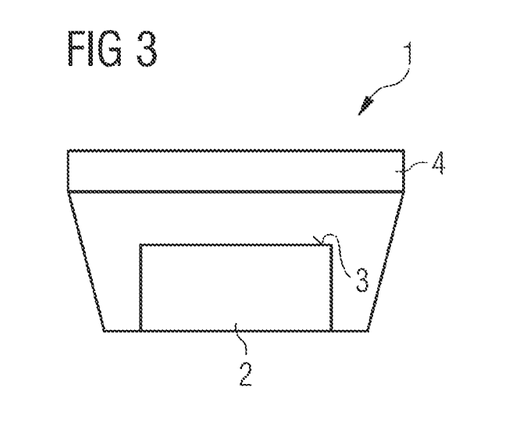

FIGS. 1-3 each show a schematic sectional view of an optoelectronic unit 1. The optoelectronic units 1 each comprise a semiconductor chip 2 with an active layer sequence and an active region (not explicitly shown here), which emits primary radiation of a first wavelength range during operation of the optoelectronic unit 1. In particular, the primary radiation is electromagnetic radiation in the visible wavelength range. For example, the semiconductor chip 2 emits in the blue wavelength range, for example a wavelength of 450 nm. The primary radiation is emitted through the radiation exit surface 3 of the semiconductor chip 2 and forms a beam path.

The optoelectronic units of FIGS. 1-3 each further comprise a component 4. The component 4 is arranged in the beam path of the primary radiation of the semiconductor chip 2 in such a way that at least a part of the primary radiation impinges on the component 4. For this purpose, the component 4 can be applied in direct contact to the semiconductor chip 2, in particular to the radiation exit surface 3 (FIGS. 1 and 2) or can be arranged spaced apart from the semiconductor chip 2 (FIG. 3). The component 4 of FIG. 1 can be for example a passivation layer of the semiconductor chip 2 or a conversion layer. In FIG. 2, component 4 is formed as a casting. Such a casting can also be a conversion casting. The component of FIG. 3 can be, for example, an optical element such as a lens or a conversion layer spaced apart from the semiconductor chip 2.

The component 4 comprises an optically active material that is not intended to be excited by the primary radiation of semiconductor chip 2 with the first wavelength range. The optically active material comprises in particular a wavelength-dependent remission or diffuse reflectivity $R(\lambda)$ of greater than or equal to 80%, preferably of greater than or equal to 90%, particularly preferably of greater than or equal to 95% in the first wavelength range, particularly in the visible wavelength range. In particular, the optically active material is selected from $CeMgAl_{11}O_{19}$:Tb, $BaMgAl_{10}O_{17}$:Eu, $LaPO_4$:Tm, $YBO_3$:Tm, $LaPO_4$:Ce, Tb, $LaMgBO_{510}$Ce, Tb, $LaMgAl_{11}O_{19}$:Ce, Tb, $Y_2O_3$:Eu, (Y, Gd) $BO_3$:Eu, $YVO_4$:Eu, and combinations thereof. For example, the optically active material comprises or consists of $CeMgAl_{11}O_{19}$:Tb.

In particular, the component 4 further comprises a matrix material in which the optically active material is embedded. Optionally, the component 4 can comprise one or more phosphors configured to convert the primary radiation of the first wavelength range into secondary radiation.

Figure 4:
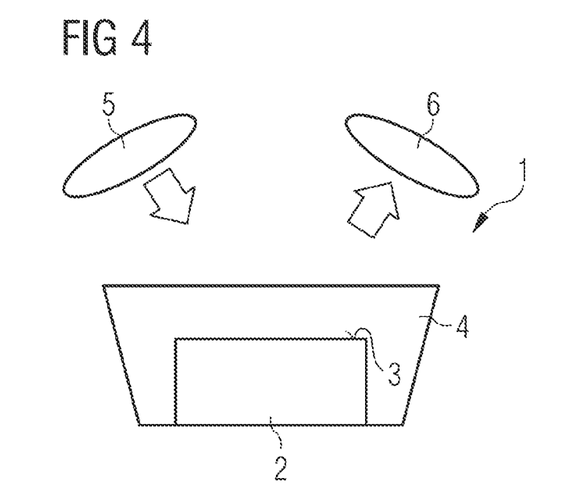
FIG. 4 shows a setup for the identification of an optoelectronic unit according to an exemplary embodiment.

FIG. 4 shows the optoelectronic unit 1 according to the exemplary embodiment of FIG. 2 in a setup for a method for identifying an optoelectronic unit. An external radiation source 5, which emits electromagnetic radiation of a second wavelength range, is arranged outside the optoelectronic unit 1. The external radiation source 5 is arranged in relation to the optoelectronic unit 1 such that the radiation from the external radiation source 5 impinges at least on the component 4 of the optoelectronic unit 1. In other words, at least the component 4 of the optoelectronic unit 1 is arranged in the beam path of the external radiation source 5. For example, the external radiation source 5 is a UV lamp or an IR lamp.

Further, the optoelectronic unit 1 comprises an external detection element 6 configured to detect the secondary radiation emitted from the component 4 after irradiation with radiation of a second wavelength range by the external radiation source 5. The external detection element 6 is arranged in relation to the optoelectronic unit 1 in such a way that the emitted secondary radiation impinges on or is directed onto the external detection element 6.

In the method for identifying an optoelectronic unit 1, the radiation of the second wavelength range is absorbed by the optically active material in component 4 and converted into radiation in the visible wavelength range. This radiation is then emitted as secondary radiation by the optoelectronic unit 1 and can be detected. Based on characteristic emission bands of the optically active material, it can be unambiguously determined that the optically active material is present in the optoelectronic unit 1. Thus, an optoelectronic unit without optically active material can be distinguished from an optoelectronic unit 1 with optically active material.

Figure 5:
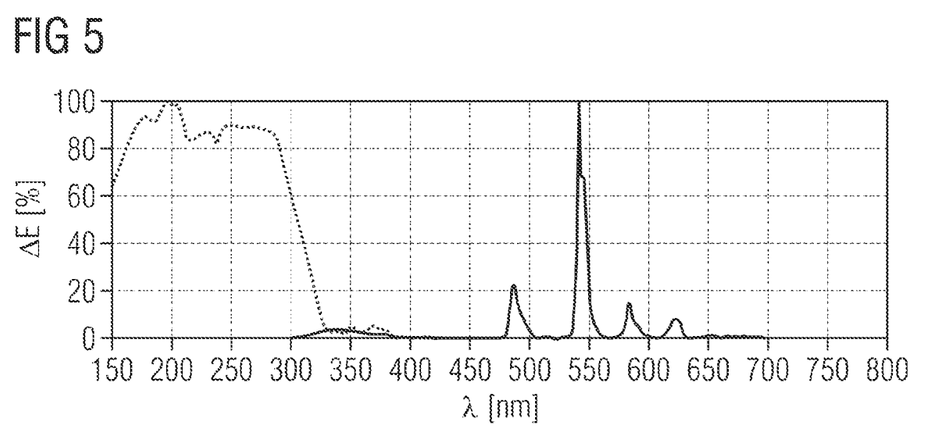
FIG. 5 shows the absorption and emission spectra of the optically active material $CeMgAl_{11}O_{19}$:Tb.

FIG. 5 shows the absorption spectrum (dashed line) and the emission spectrum (solid line) of the optically active material $CeMgAl_{11}O_{19}$:Tb. The relative energy AE in percent is plotted versus the wavelength z in nm. The optically active material $CeMgAl_{11}O_{19}$:Tb exclusively shows significant absorption bands below 350 nm and is excitable particularly efficient with wavelengths below 300 nm. In particular, no significant excitation is possible with light around 450 nm. The emission spectrum of the optically active material $CeMgAl_{11}O_{19}$:Tb shows a characteristic line spectrum in the green spectral range.

Figure 6A:
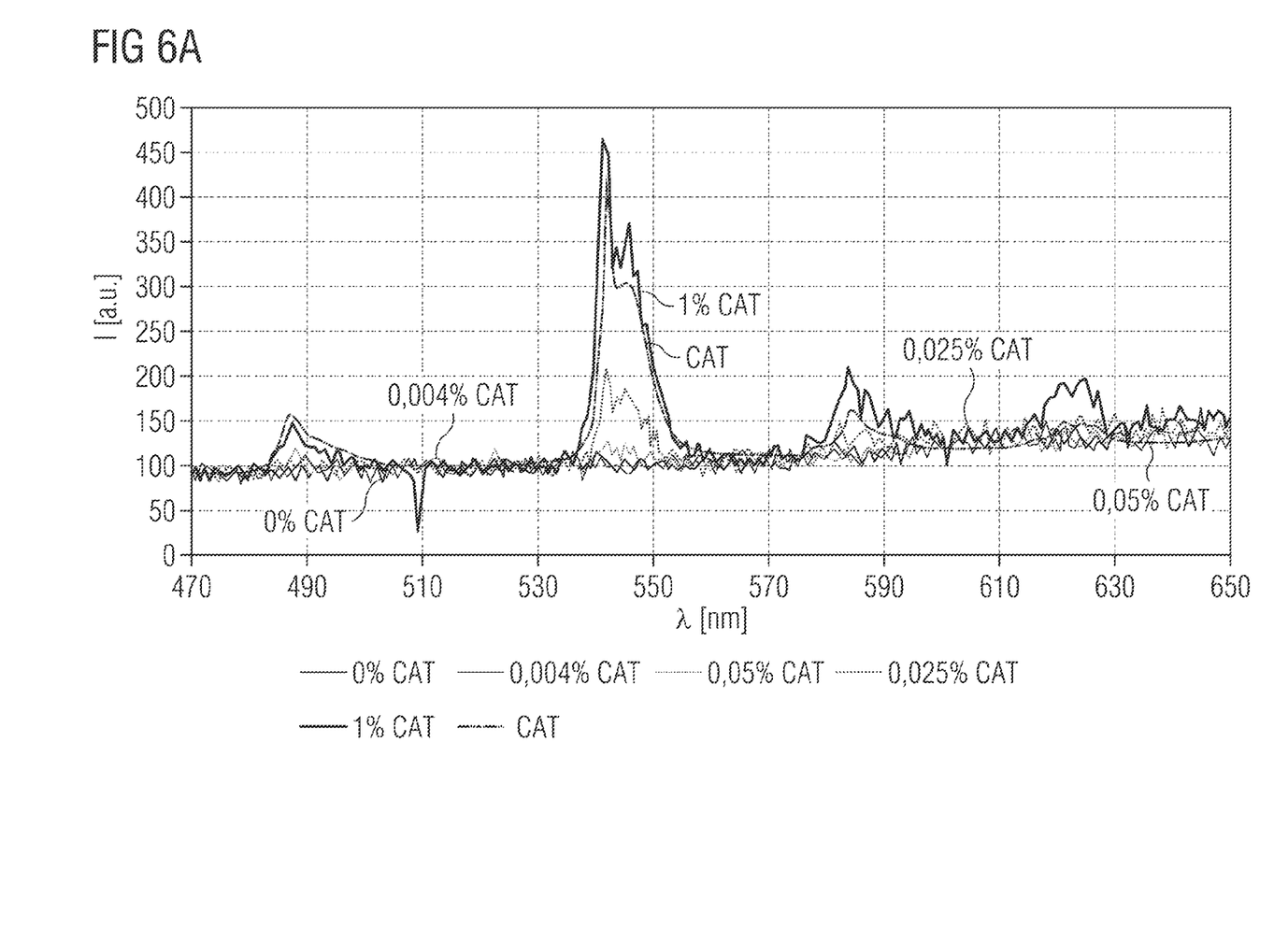
FIGS. 6A and 6B show emission spectra of optoelectronic units after external excitation according to various exemplary embodiments and comparative examples.
Figure 6B:
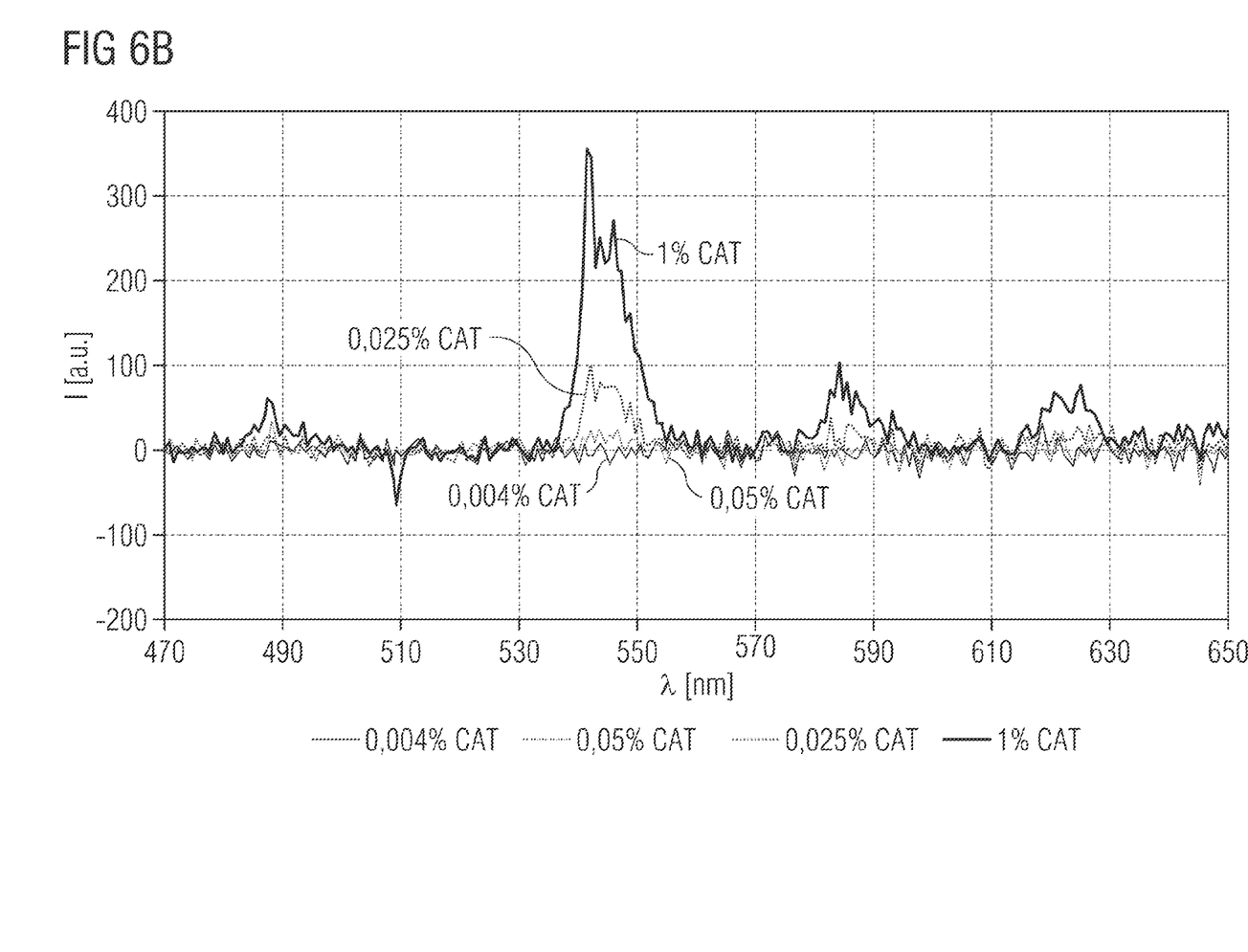

FIG. 6A shows emission spectra of optoelectronic units 1 with different amounts of the optically active material $CeMgAl_{11}O_{19}$:Tb in a converter-silicone mixture after external excitation with UV radiation of 280 nm in an integrating sphere. Intensity I in arbitrary units (a.u.) is plotted versus the wavelength $\lambda$ in nm. As comparative examples, the emission spectrum of an optoelectronic unit without active material (0% CAT) and the emission spectrum of pure $CeMgAl_{11}O_{19}$:Tb (CAT) are shown. FIG. 6B shows the difference spectra of the optoelectronic units 1 with optically active material, wherein the comparison spectrum of the optoelectronic unit without optically active material has been subtracted.

In FIGS. 6A and 6B, the characteristic emission bands of the optically active material $CeMgAl_{11}O_{19}$:Tb can clearly be seen in the spectra of optoelectronic unit 1 with 0.25% CAT and 1% CAT after external excitation. A residual signal can also be observed in the spectrum of optoelectronic unit 1 with 0.05% CAT upon close inspection.

Figure 7A:
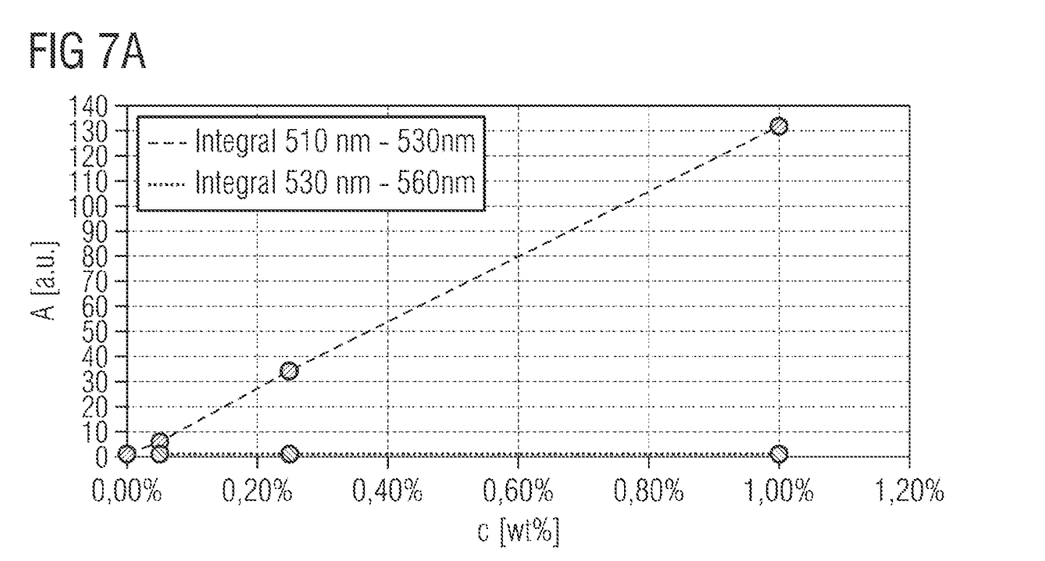
FIGS. 7A and 7B show a comparison of the integrated emission spectra after external excitation of optoelectronic units according to various exemplary embodiments.
Figure 7B:
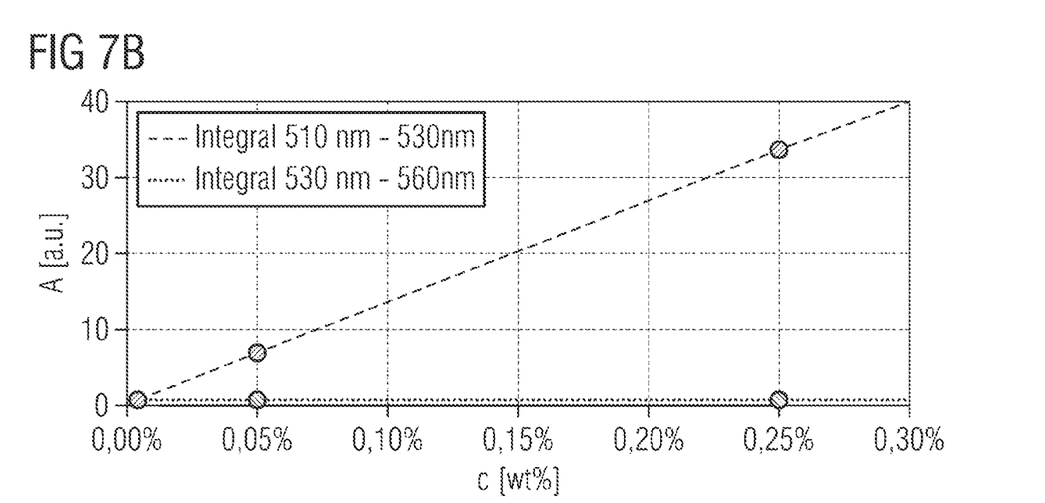

FIG. 7A shows the calculated area under the emission curve of FIG. 6B for the wavelength range from 510 nm to 530 nm and the wavelength range from 530 nm to 560 nm. The area under the curve A in arbitrary units (a.u.) is plotted versus the concentration of the optically active material $CeMgAl_{11}O_{19}$:Tb in weight percent (wt %). In the wavelength range from 510 nm to 530 nm, no emission signal is expected in any case. Therefore, the area under the emission curve is close to zero. In the wavelength range of 530-560 nm, there is an intense emission band of the optically active material $CeMgAl_{11}O_{19}$:Tb. FIG. 7A clearly shows that the area under the emission curve in this wavelength range increases with increasing concentration of the optically active material. FIG. 7B shows a section of FIG. 7A in which it can be clearly seen that a residual signal can already be observed at a concentration of the optically active material $CeMgAl_{11}O_{19}$:Tb of 0.05 wt. %.

Figure 8:
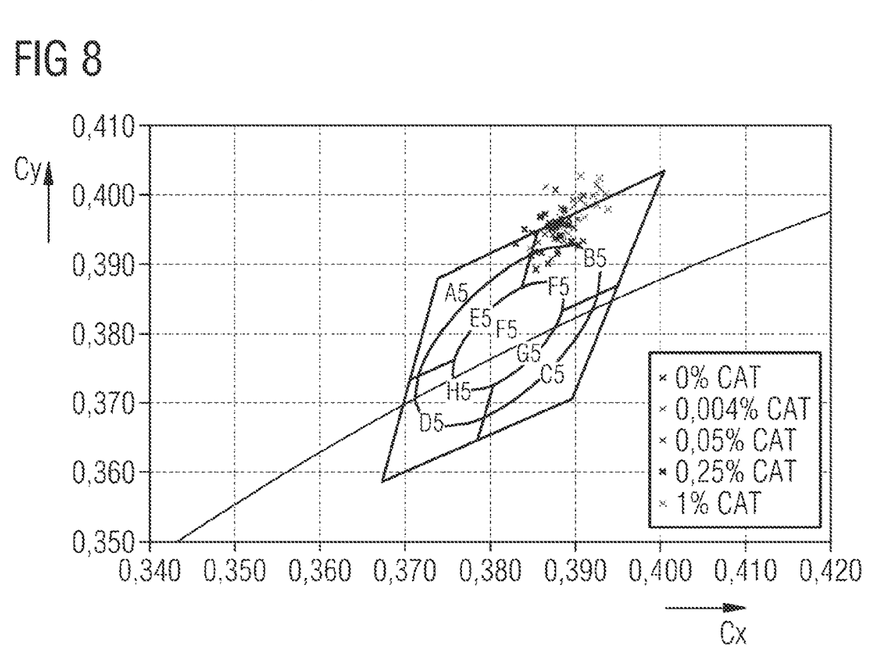
FIG. 8 shows the color locations of optoelectronic units according to various exemplary embodiments and a comparative example.

FIG. 8 shows the color locations of optoelectronic units 1 with a semiconductor chip 2 emitting a wavelength of 450 nm and different proportions of the optically active material $CeMgAl_{11}O_{19}$:Tb in a converter-silicone mixture as well as a comparative example without optically active material (0% CAT) in a CIE color diagram. Within normal manufacturing tolerances, no direct influence of the concentration of the optically active material on the color location can be detected. Thus, the optically active material has only very little influence on the scattering in the optoelectronic unit, in particular due to its low concentration in the casting. Moreover, the slight deviations of the color location can already be caused by the manual dispensing process and varying casting heights within the normal manufacturing tolerances.

Figure 9:
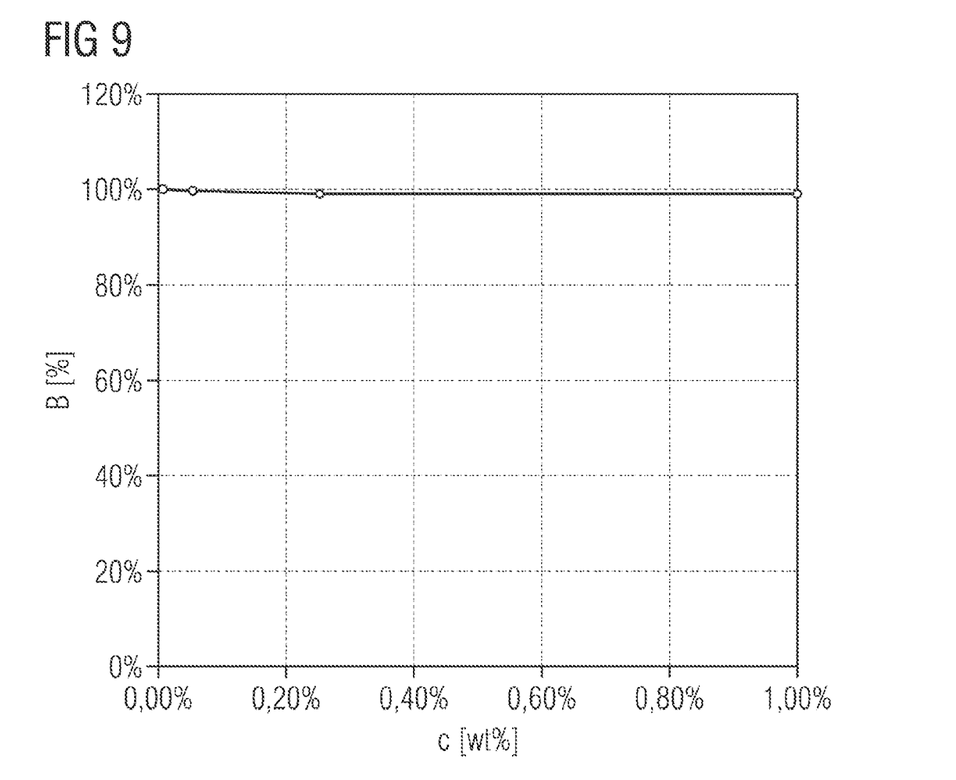
FIG. 9 shows the relative brightness of optoelectronic units according to various exemplary embodiments.

FIG. 9 shows the relative brightness of optoelectronic units 1 with a semiconductor chip 2 emitting a wavelength of 450 nm and different proportions of the optically active material $CeMgAl_{11}O_{19}$:Tb in a converter-silicone mixture. The brightness B in % is plotted versus the concentration of the optically active material $CeMgAl_{11}O_{19}$:Tb in wt %. The brightness loss is less than one percentage point regardless of the amount of optically active material in the optoelectronic unit.

Figure 10:
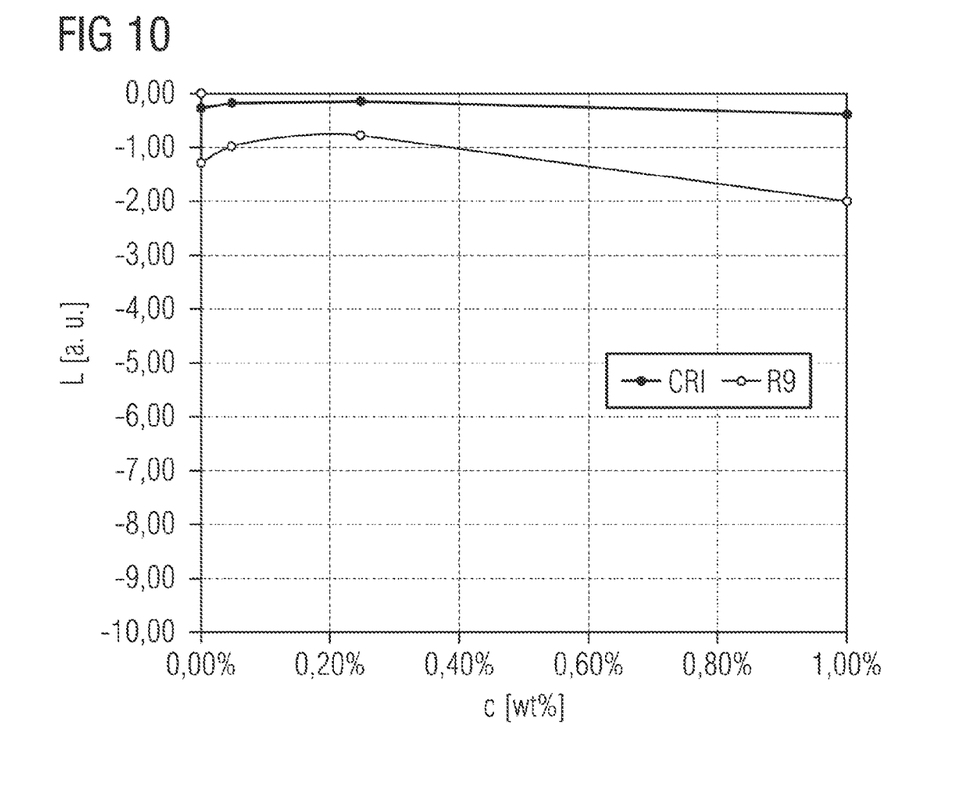
FIG. 10 shows the color rendering index and R9 value of optoelectronic units according to various exemplary embodiments.

FIG. 10 shows the color rendering index (CRI) and the R9 value of optoelectronic units 1 with a semiconductor chip 2 emitting a wavelength of 450 nm and different amounts of the optically active material $CeMgAl_{11}O_{19}$:Tb in a converter-silicone mixture. The reduction L in arbitrary units (a.u.) is plotted versus the concentration of the optically active material $CeMgAl_{11}O_{19}$:Tb in wt %. For the concentrations of the optically active material shown, there is almost no effect on the color rendering indices of the optoelectronic units. The influence on the R9 value is also small.

It should be noted that the exact values of CRI and in particular also of R9 for common white conversion LEDs are subject to small fluctuations depending on the exact color location coordinates. The fluctuations of CRI and R9 observed in the experiment are within this expected and usual range.

Figure 11:
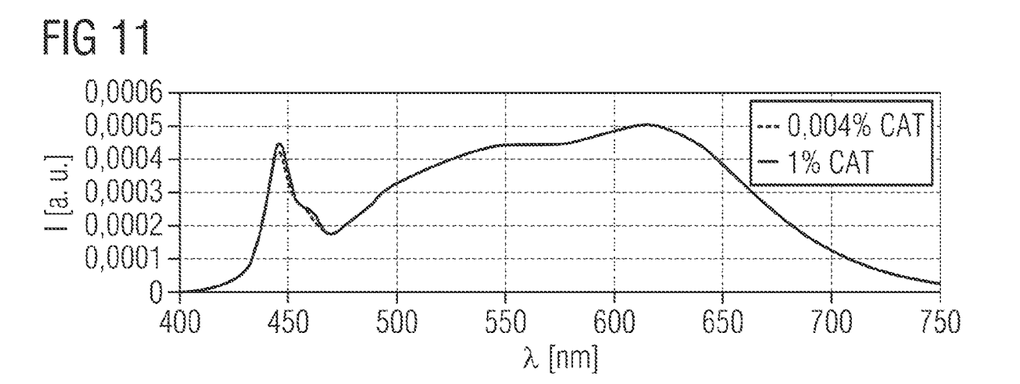
FIG. 11 shows the emission spectra of optoelectronic units according to various exemplary embodiments.

FIG. 11 shows the emission spectra of optoelectronic units 1 with a semiconductor chip 2 emitting a wavelength of 450 nm and 0.004 wt % or 1 wt % of the optically active material $CeMgAl_{11}O_{19}$:Tb in a converter-silicone mixture. The emission spectra show the primary radiation of the semiconductor chip with a band at 450 nm and the secondary radiation of the converter material in the visible wavelength range. There is substantially no difference in the spectra between the different proportions for the optically active material. Accordingly, the optically active material does not influence the emission spectrum of the optoelectronic unit during operation.

Figure 12A:
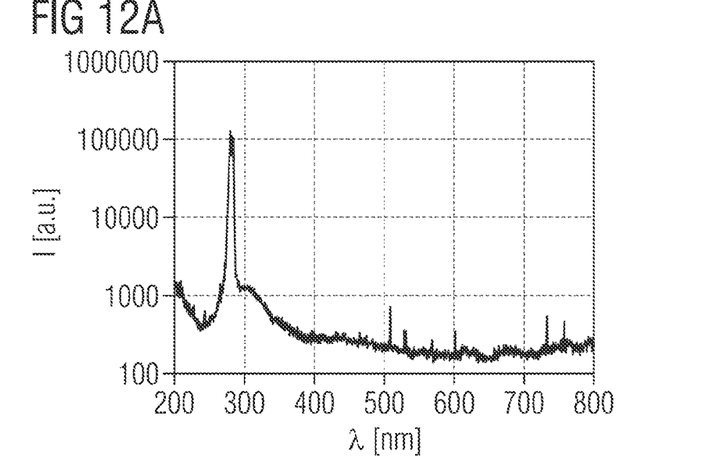
FIGS. 12A to 12C show emission spectra after external excitation according to an exemplary embodiment of the method for identifying an optoelectronic unit.
Figure 12B:
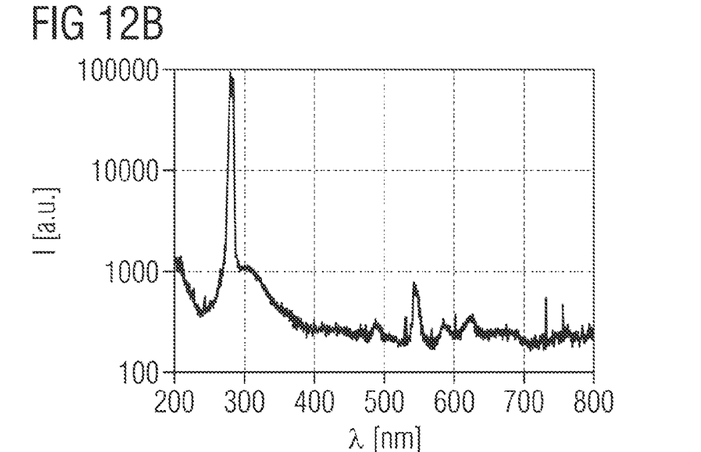
Figure 12C:
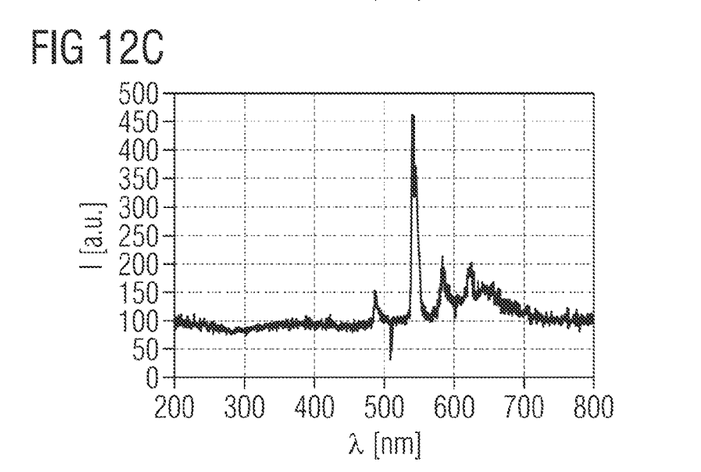

FIGS. 12A to 12C show emission spectra according to an exemplary embodiment of the method for identifying an optoelectronic unit. FIG. 12A shows the reference spectrum of an empty holder after excitation with 280 nm, FIG. 12B shows the data spectrum of an optoelectronic unit 1, which comprises the optically active material $CeMgAl_{11}O_{19}$:Tb, on the holder after external excitation with 280 nm, and FIG. 12C shows the resulting difference spectrum in which the reference spectrum has been subtracted from the data spectrum. In the difference spectrum of FIG. 12C, the characteristic emission bands of the line spectrum of the optical material $CeMgAl_{11}O_{19}$:Tb are clearly visible (compare also FIG. 5).

Figure 13:
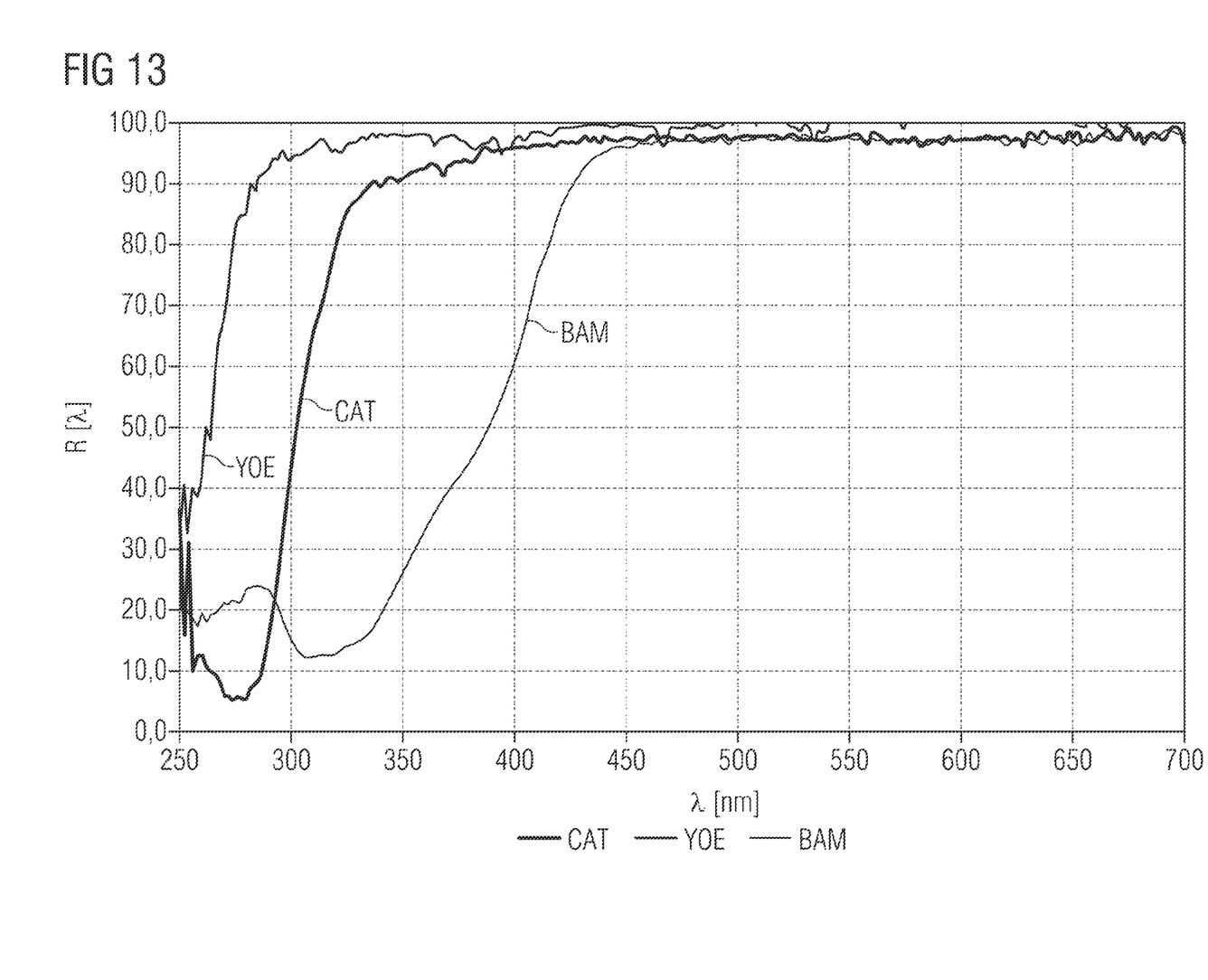
FIG. 13 shows remission curves for optically active materials according to various exemplary embodiments.

FIG. 13 shows remission curves for the optically active materials $CeMgAl_{11}O_{19}$:Tb (CAT), $BaMgAl_{10}O_{17}$:Eu (BAM) and $Y_2O_3$:Eu (YOE). It can be clearly seen that the optically active materials comprise a wavelength-dependent remission or diffuse reflectivity $R(\lambda)$ of significantly over 95% in the entire wavelength range from 450 nm to 700 nm. $BaMgAl_{10}O_{17}$:Eu shows a remission below 70% for wavelengths below 410 nm, $CeMgAl_{11}O_{19}$:Tb for wavelengths below 320 nm and $Y_2O_3$:Eu for wavelengths below 270 nm.

Figure 14:
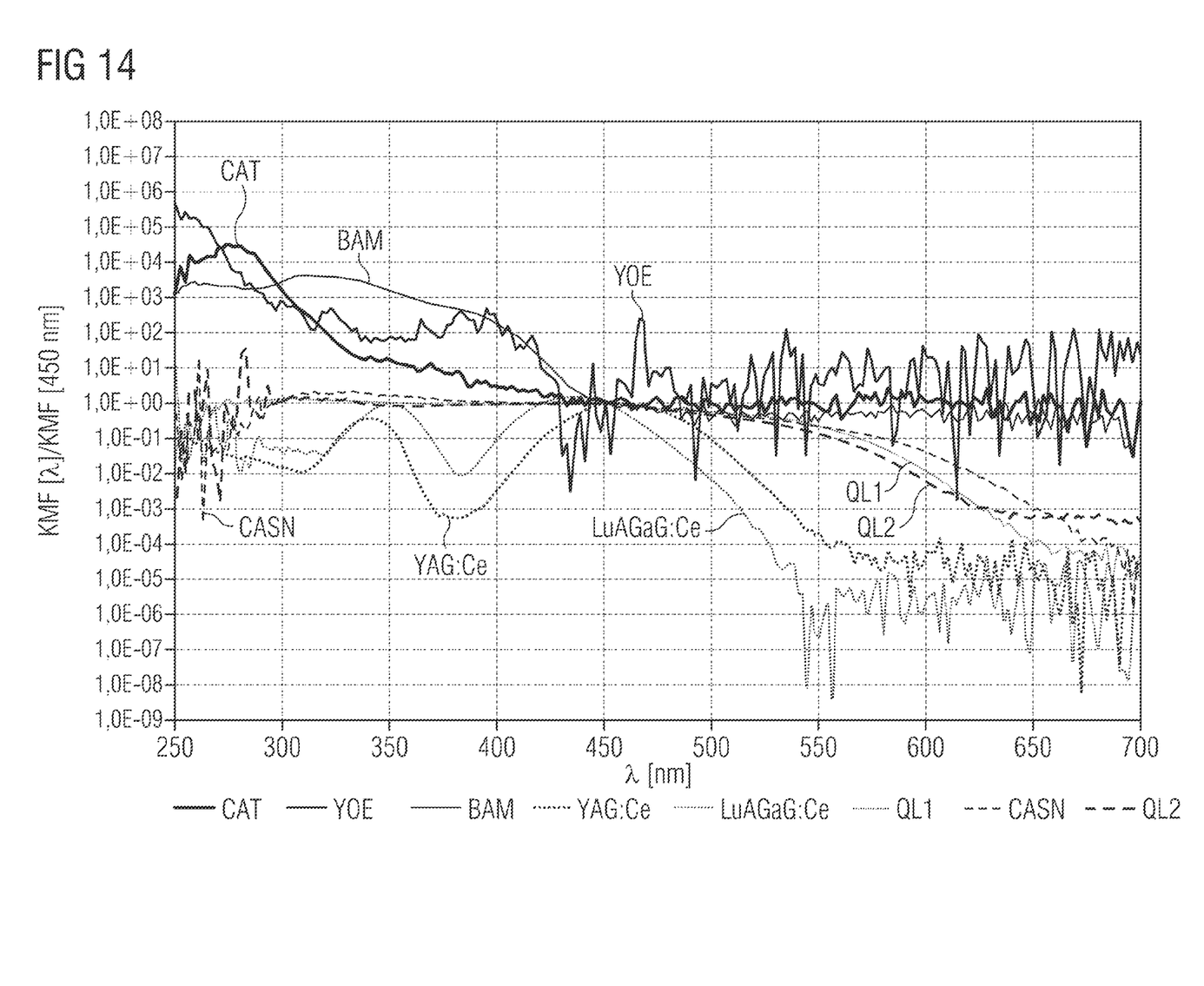
FIG. 14 shows the relative Kubelka-Munk function for optically active materials according to various exemplary embodiments and comparative examples.

FIG. 14 shows the relative Kubelka-Munk functions normalized to the value at 450 nm for the optically active materials $CeMgAl_{11}O_{19}$:Tb (CAT), $BaMgAl_{10}O_{17}$:Eu (BAM) and $Y_2O_3$:Eu (YOE) and for the phosphors YAG:Ce, LuAGaG:Ce, QL1, QL2 and CASN, which are typically used for white-emitting optoelectronic units with blue-emitting semiconductor chips. YAG:Ce and LuAGaG:Ce here stand for phosphors of the type $Y_3Al_5O_{12}$:Ce and $Lu_3(Al, Ga)_5O_{12}$:Ce, respectively, with blue-green to orange-yellow emission. Both are exemplary representatives of the material family of garnet phosphors with the more general formula $(Y, Gd, Tb, Lu)_3(Al, Ga)_5O_{12}$:Ce. QL1 and QL2 denote two representatives from the material family $Sr(Sr,Ca)Si_2Al_2N_6$:Eu with orange-red to deep-red emission.

CASN denotes one representative from the material family $(Sr,Ca)AlSiN_3$:Eu with orange-red to deep-red emission.

The relative Kubelka-Munk functions for the phosphors YAG:Ce, LuAGaG:Ce, QL1, QL2, and CASN show no increase for wavelengths below 450 nm, whereas the optically active materials CAT, BAM, and YOE comprise values greater than 1 for the relative Kubelka-Munk function for wavelengths below 450 nm. The optically active material BAM shows a relative Kubelka-Munk function greater than 100 below 415 nm. The optically active material YOE shows a relative Kubelka-Munk function greater than 1000 below 365 nm and the optically active material CAT shows a relative Kubelka-Munk function greater than 1000 below 300 nm. Thus, these optically active materials absorb substantially more strongly in these wavelength ranges than at 450 nm.

The features and exemplary embodiments described in conjunction with the figures can be combined with each other according to further exemplary embodiments, even if not all combinations are explicitly described. Furthermore, the exemplary embodiments described in conjunction with the figures can alternatively or additionally comprise further features according to the description in the general part.

The invention is not limited to the exemplary embodiments by the description thereof. Rather, the invention encompasses any new feature as well as any combination of features, which in particular includes any combination of features in the patent claims, even if that feature or combination itself is not explicitly stated in the patent claims or exemplary embodiments.

LIST OF REFERENCE SIGNS 1 optoelectronic unit
2 semiconductor chip
3 radiation exit surface
4 component
5 external radiation source
6 external detection element

The invention claimed is:
1. An optoelectronic unit comprising
a semiconductor chip configured to emit primary radiation with a first wavelength range during operation of the optoelectronic unit,
a component comprising an optically active material, wherein
the component is arranged at least partially in the beam path of the semiconductor chip,
the optically active material is not intended to be excited by the primary radiation with the first wavelength range, and the optically active material comprises a proportion in the component of 0.004 wt %, inclusive, to 1 wt %, inclusive.

2. The optoelectronic unit according to claim 1, wherein the semiconductor chip emits primary radiation in the visible wavelength range.

3. The optoelectronic unit according to claim 1, wherein the component comprises at least one phosphor configured to at least partially convert the radiation of the semiconductor chip into secondary radiation.

4. The optoelectronic unit according to claim 1, wherein the optoelectronic unit emits radiation in the visible wavelength range during operation.

5. The optoelectronic unit according to claim 1, wherein the component comprises or is an optical element, a casting, a conversion layer, or a passivation layer of the semiconductor chip.

6. The optoelectronic unit according to claim 1, wherein the optoelectronic unit is free of a semiconductor chip or an optically active element configured to excite the optically active material.

7. The optoelectronic unit according to claim 1, wherein the optically active material substantially does not absorb radiation in the visible spectral range.

8. The optoelectronic unit according to claim 1, wherein the optically active material is substantially transparent to radiation emitted by the optoelectronic unit during operation.

9. The optoelectronic unit according to claim 1, wherein the optically active material does not substantially affect the optical properties of the optoelectronic unit.

10. The optoelectronic unit according to claim 1, wherein the optically active material is configured to absorb radiation of a second wavelength range and to convert it into secondary radiation.

11. The optoelectronic unit according to claim 10, wherein the second wavelength range comprises shorter wavelengths than the first wavelength range, and wherein the optically active material converts the radiation of the second wavelength range into radiation with longer wavelengths.

12. The optoelectronic unit according to claim 10, wherein the second wavelength range comprises longer wavelengths than the first wavelength range and wherein the optically active material converts the radiation of the second wavelength range into radiation with shorter wavelengths.

13. The optoelectronic unit according to claim 1, wherein the optically active material comprises a recognizable emission spectrum.

14. The optoelectronic unit according to claim 1, wherein the optically active material comprises $CeMgAl_{11}O_{19}$:Tb, $BaMgAl_{10}O_{17}$:Eu and/or $Y_2O_3$:Eu or consists of $CeMgAl_{11}O_{19}$:Tb, $BaMgAl_{10}O_{17}$:Eu and/or $Y_2O_3$:Eu.

15. A method for identifying an optoelectronic unit comprising
providing an optoelectronic unit according to claim 1,
irradiating the optoelectronic unit with electromagnetic radiation of a second wavelength range from outside the optoelectronic unit,
detecting the secondary radiation emitted by the optoelectronic unit.

16. The method according to claim 15, wherein the second wavelength range comprises shorter wavelengths than the first wavelength range.

17. The method according to claim 15, wherein the second wavelength range comprises longer wavelengths than the first wavelength range.

18. The method according to claim 15, wherein the optoelectronic unit is identifiable by means of the secondary radiation.

19. The method according to claim 15, wherein the optically active material converts the radiation of the second wavelength range into radiation in the visible wavelength range.

20. An optoelectronic unit comprising
a semiconductor chip configured to emit primary radiation with a first wavelength range during operation of the optoelectronic unit, and
a component comprising an optically active material, wherein
the component is arranged at least partially in the beam path of the semiconductor chip,
the optically active material is not intended to be excited by the primary radiation with the first wavelength range,
the optoelectronic unit is free of a semiconductor chip and an optically active element configured to excite the optically active material.

* * * * *